United States Patent
Kim

(10) Patent No.: US 8,406,012 B2
(45) Date of Patent: Mar. 26, 2013

(54) FLAT PANEL DISPLAY

(75) Inventor: Min-Cheol Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 527 days.

(21) Appl. No.: 12/656,707

(22) Filed: Feb. 12, 2010

(65) Prior Publication Data

US 2011/0063265 A1 Mar. 17, 2011

(30) Foreign Application Priority Data

Sep. 15, 2009 (KR) .................. 10-2009-0086924

(51) Int. Cl.
*H05K 9/00* (2006.01)
*G06F 3/038* (2006.01)
*G02F 1/1333* (2006.01)

(52) U.S. Cl. ... 361/816; 361/800; 361/818; 361/679.01; 345/59; 345/60; 345/68; 345/205

(58) Field of Classification Search .................. 361/800, 361/816, 818; 345/905; 349/58–60
See application file for complete search history.

(56) References Cited

U.S. PATENT DOCUMENTS

| | | | |
|---|---|---|---|
| 7,089,646 B2* | 8/2006 | Leerkamp et al. | 29/592.1 |
| 7,196,750 B2* | 3/2007 | Koo et al. | 349/59 |
| 7,692,918 B2* | 4/2010 | Choi et al. | 361/679.21 |
| 2006/0197718 A1 | 9/2006 | Yamate | |
| 2008/0285222 A1* | 11/2008 | Yeo et al. | 361/681 |
| 2011/0063272 A1 | 3/2011 | Kim | |

FOREIGN PATENT DOCUMENTS

| | | |
|---|---|---|
| JP | 2-165512 A | 6/1990 |
| JP | 2000112392 | 4/2000 |
| JP | 2002-261484 | 9/2002 |
| JP | 2005-326757 A | 11/2005 |
| JP | 2006-195177 A | 7/2006 |
| JP | 2007-147910 A | 6/2007 |
| JP | 4153951 B2 | 7/2008 |
| JP | 2009-169374 A | 7/2009 |
| KR | 101998040876 A | 8/1998 |
| KR | 10-2001-0049113 | 6/2001 |
| KR | 10-2002-0046823 | 6/2002 |
| KR | 1020060061938 A | 6/2006 |
| KR | 10-2006-0111077 | 10/2006 |

(Continued)

OTHER PUBLICATIONS

Korean Office Action issued by KIPO on Jul. 27, 2011 in connection with Korean Patent Application No. 10-2009-0086924 and Request for Entry of the Accompanying Office Action attached herewith.

(Continued)

*Primary Examiner* — Michail V Datskovskiy
(74) *Attorney, Agent, or Firm* — Robert E. Bushnell, Esq.

(57) ABSTRACT

In a flat panel display (FPD), a conductive heat proof plate is inserted between the back surface of a display panel, on which printed circuit boards (PCBs) and signal lines are formed, and signal lines. A back frame positioned on the back surface of the display panel is provided to cover the printed circuit boards and the signal lines. A shield can is formed in the internal surface region of the back frame corresponding to the printed circuit board on which a timing controller is mounted. The shield can is electrically coupled to the heat proof plate to improve resistance against the electromagnetic compatibility of a large flat panel display and to improve a thermal characteristic.

18 Claims, 4 Drawing Sheets

FOREIGN PATENT DOCUMENTS

| KR | 10-2006-0131313 | 12/2006 |
|----|----|----|
| KR | 1020070020610 A | 2/2007 |
| KR | 10-2007-0097200 | 10/2007 |
| KR | 10-2008-0044962 A | 5/2008 |

OTHER PUBLICATIONS

Korean Office action issued by KIPO on Oct. 31, 2011, corresponding to Korean Patent Application No. 10-2009-0086923 (Cited in the cross-referenced U.S. Appl. No. 12/656,706; in the Information Disclosure Statement filed on Dec. 27, 2011.) and Request for Entry attached herewith.

Korean Office action issued by KIPO, dated Mar. 16, 2011, corresponding to Korean Patent Application No. 10-2009-0086923, together with Request for Entry which was cited in the Information Disclosure Statement filed May 19, 2011, in the Cross References U.S. Appl. No. 12/656,706.

Japanese Office action issued by Japanese Patent Office on Nov. 15, 2011 corresponding to Japanese Patent Application No. 2009-281803 and Request for Entry attached herewith. (Cited in the Information Disclosure Statement of U.S. Appl. No. 12/656,706, filed Jan. 10, 2012).

Korean Office Action issued by KIPO, dated Mar. 4, 2011, corresponding to Korean Patent Application No. 10-2009-0086924, together with Request for Entry.

* cited by examiner

FLAT PANEL DISPLAY

CLAIM OF PRIORITY AND CROSS-REFERENCE TO RELATED APPLICATIONS

This application makes reference to, incorporates the same herein, and claims all benefits accruing under 35 U.S.C. §119 from an application entitled FLAT PANEL DISPLAY filed in the Korean Intellectual Property Office on Sep. 15, 2009 and there duly assigned Serial No. 10-2009-0086924. Furthermore, the present application is related to a co-pending U.S. application Ser. No. 12/656,706, entitled Flat Panel Displays, based upon Korean Patent Application Serial No. 10-2009-0086923 filed in the Korean Intellectual Property Office on Sep. 15, 2009, and filed in the U.S. Patent & Trademark Office concurrently with the present application.

BACKGROUND OF THE INVENTION

1. Field of the Invention

The present invention relates to a flat panel display (FPD) and, more particularly, to a flat panel display capable of effectively dispersing the heat generated by a panel, and a printed circuit board (PCB) and blocking electromagnetic interference (EMI) generated therein to improve resistance against electromagnetic compatibility (EMC).

2. Description of the Related Art

A flat panel display (FPD) is divided into an emission type flat panel display, such as an organic light emitting display (OLED) and a plasma display panel (PDP); and a non-emission type flat panel display which does not emit light like a liquid crystal display (LCD).

The flat panel display includes a display panel for displaying an image, a driver for providing a predetermined signal to the pixels provided in the display panel, and a controller for controlling the driver.

In this regard, the driver and the controller are mounted on printed circuit boards (PCBs) and the printed circuit boards are provided on the back surface of the display panel.

The printed circuit board on which the driver is mounted and the printed circuit board on which the controller is mounted are positioned on the opposite surface, that is, the back surface of the display panel for displaying an image. A plurality of signal lines for transmitting and receiving signals between the driver and the controller are formed between the printed circuit board on which the driver is mounted and the printed circuit board on which the controller is mounted. The printed circuit boards and the signal lines are fixed to the back surface of the panel by an adhesive tape.

A front frame which is positioned on the front surface of the display panel and in which an image display region is opened, and a back frame positioned on the back surface of the display panel, are fastened to each other so that the assembly of the flat panel display is completed.

In the case of the flat panel display having the above structure, harmful radio waves are generated by the printed circuit boards, various elements mounted on the printed circuit boards, and the signal lines coupled between the printed circuit boards. The generation of such radio waves is severely restricted.

Among the restricted harmful radio waves, when electromagnetic waves are taken as an example, it is determined that the electromagnetic waves have electromagnetic compatibility (EMC) for testing whether the electromagnetic waves are suitable for an environment, electromagnetic interference (EMI) which may be a cause of interference no less than a predetermined level against an external apparatus in the electromagnetic compatibility, and electromagnetic susceptibility (EMS) which may disturb the operation of a corresponding apparatus by external electromagnetic waves.

Therefore, the electromagnetic interference noise unnecessarily generated by the flat panel display is reduced as much as possible, and the electromagnetic susceptibility is reduced against the external electromagnetic wave environment to enhance the resistance against the electromagnetic waves of the flat panel display and to improve the resistance against the electromagnetic compatibility.

Since the printed circuit boards and the signal lines formed on the back surface of the display panel are covered with a back frame, the electromagnetic interference applied from the outside can be blocked. However, the internal electromagnetic interference generated by various electronic elements which constitute the driver and the controller mounted on the printed circuit boards is excited by adjacent electronic elements by the metal back frame. That is, the flat panel display is vulnerable to the internal electromagnetic interference.

In addition, in the case of the flat panel display having the above structure, since the printed circuit boards are directly attached on the back surface of the display panel by the adhesive tape, a path which can effectively disperse the heat generated by the display panel and the heat generated by the printed circuit board is not formed so that, when the flat panel display operates for a long time, the flat panel display is vulnerable to the heat.

SUMMARY OF THE INVENTION

Accordingly, the present invention has been developed to provide a flat panel display (FPD) in which a conductive heat proof plate is inserted between the back surface of a display panel on which printed circuit boards (PCBs) and signal lines are formed; and in which a back frame positioned on the back surface of the display panel is provided to cover the printed circuit boards and the signal lines, in which a shield can is formed in the internal surface region of the back frame corresponding to the printed circuit board on which a timing controller is mounted, and in which the shield can is electrically coupled to the heat proof plate to improve resistance against the electromagnetic compatibility of a large flat panel display and to improve a thermal characteristic.

In order to achieve the foregoing and/or other aspects of the present invention, the present invention provides a flat panel display (FPD), comprising a display module including a display panel for displaying an image on a front surface, first and second printed circuit boards (PCB) attached on a back surface of the display panel and electrically coupled to a scan driver and a data driver, a third printed circuit board on which a timing controller is mounted, a plurality of signal lines coupled between the printed circuit boards to transmit and receive signals between the printed circuit boards, and a heat proof plate inserted between the back surface of the display panel and the first to third printed circuit board and a front frame and a back frame coupled to a front surface and a back surface of the display module, respectively. A shield can formed to cover the timing controller is formed in an internal surface region of the back frame corresponding to a third printed circuit board on which the timing controller is mounted.

The shield can completely overlaps an area of the third printed circuit board on which the timing controller is mounted and includes walls corresponding to circumferential edges of the third printed circuit board.

A conductive tape is formed on a bottom surface of the shield can walls that contact the heat proof plate so that the heat proof plate is electrically coupled to the shield can.

A plurality of sleet holes for exhausting heat generated by the third printed circuit board to the air are formed on a top surface of the shield can. Signal line through holes are formed in a partial region of walls of the shield can so that signal lines coupled from the third printed circuit board on which the timing controller is mounted to the first and second printed circuit boards pass through.

An elastic cushion tape is attached on a top surface of the signal line through a hole, and a conductive tape formed on a bottom surface of the shield can walls is attached to the bottom surface of the cushion tape.

A conductive shield tape having an area that overlaps the signal lines is further formed between the conductive tape and the signal lines.

The scan driver and the data driver are formed of a plurality of ICs. The plurality of ICs that constitute the data driver are mounted on flexible printed circuit boards (FPCBs), and the flexible printed circuit boards are coupled to the second printed circuit board.

The heat proof plate is made of a material having high conductivity and thermal conductivity. An external surface of the heat proof plate is formed of an adhesive material. The heat proof plate is made of a material having a color having high reflectance.

According to the present invention, the conductive heat proof plate is inserted into the bottom surface of the display panel on which the printed circuit boards and the signal lines are formed, the back frame positioned on the back surface of the display panel is provided to cover the printed circuit boards and the signal lines, the shield can is formed in the internal surface region of the back frame corresponding to the printed circuit board on which the timing controller is mounted, and the shield can is electrically coupled to the heat proof plate to improve the resistance against the electromagnetic compatibility of the large flat panel display and to improve the thermal characteristic.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
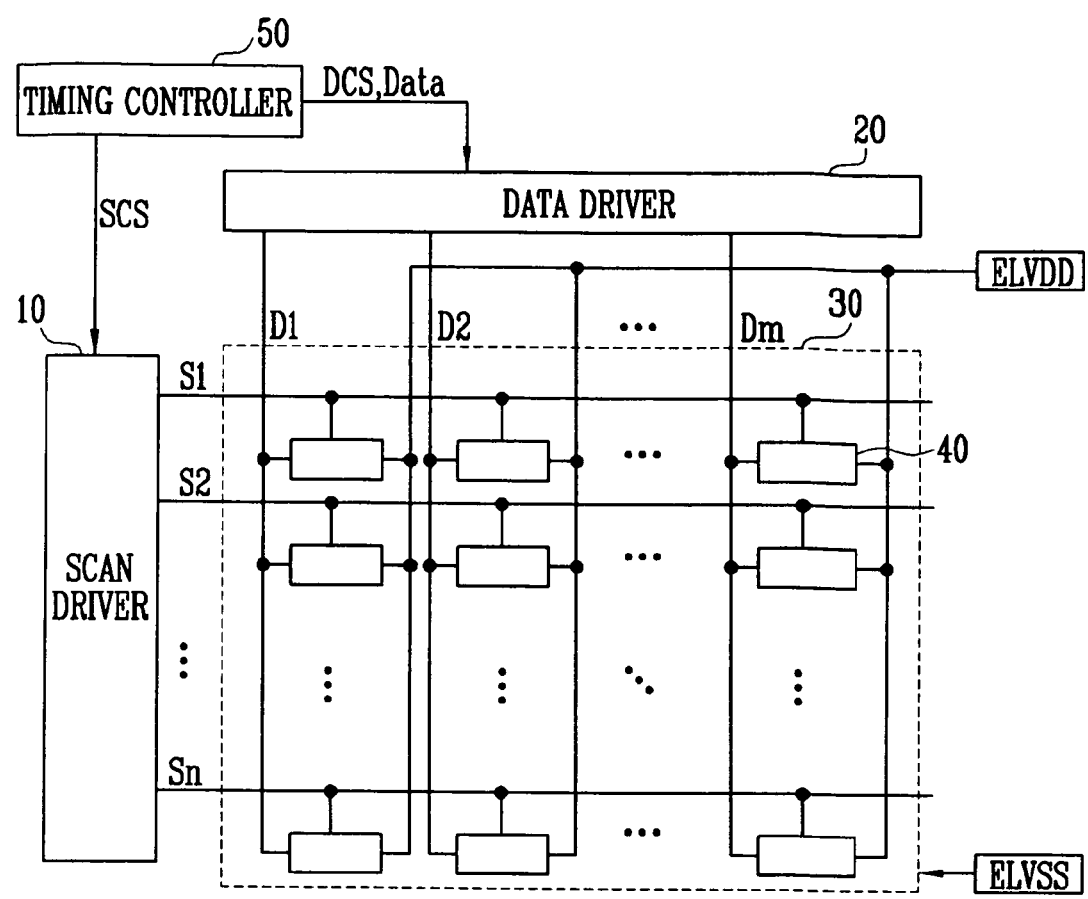
FIG. 1 is a block diagram illustrating the structure of a flat panel display (FPD) according to an embodiment of the present invention.

In the following detailed description, only certain exemplary embodiments of the present invention have been shown and described, simply by way of illustration. As those skilled in the art will realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on another element or be indirectly on another element with one or more intervening elements interposed therebetween. Also, when an element is referred to as being "connected to" another element, it can be directly connected to another element or be indirectly connected to another element with one or more intervening elements interposed therebetween. Hereinafter, like reference numerals refer to like elements.

Hereinafter, the exemplary embodiment will be described in detail with reference to the accompanying drawings.

FIG. 1 is a block diagram illustrating the structure of a flat panel display (FPD) according to an embodiment of the present invention.

In FIG. 1, an organic light emitting display is taken as an example, which is one embodiment. However, the flat panel display according to the embodiment of the present invention is not limited to the above.

Referring to FIG. 1, the organic light emitting display as the flat panel display according to the embodiment of the present invention includes a display panel 30 including a plurality of pixels 40 coupled to scan lines S1 to Sn and data lines D1 to Dm, a scan driver 10 for driving scan lines S1 to Sn, a data driver 20 for driving data lines D1 to Dm, and a timing controller 50 for controlling the scan driver 10 and the data driver 20.

The timing controller 50 generates driving control signals DCS and scan driving control signals SCS to correspond to the synchronizing signals supplied from the outside. The data driving control signals DCS generated by the timing controller 50 are supplied to the data driver 20, and the scan driving control signals SCS are supplied to the scan driver 10. The timing controller 50 supplies the data Data supplied from the outside to the data driver 20.

The scan driver 10 receives the scan driving control signals SCS from the timing controller 50. The scan driver 10 which receives the scan driving control signals SCS generates scan signals and sequentially supplies the generated scan signals to the scan lines S1 to Sn.

The data driver 20 receives the data driving control signals DCS from the timing controller 50. The data driver 20 which receives the data driving control signals DCS generates data signals and supplies the generated data signals to the data lines D1 to Dm in synchronization with the scan signals.

The display panel 30 receives a first power source ELVDD and a second power source ELVSS so as to supply the received first power source ELVDD and second power source ELVSS to the pixels 40. The pixels 40, which receive the first power source ELVDD and the second power source ELVSS, control the current that flows from the first power source ELVDD to the second power source ELVSS via a light emitting element so as to correspond to the data signals and generate light components corresponding to the data signals.

That is, the flat panel display according to the embodiment of the present invention includes a display panel 30 for displaying an image, the scan/data drivers 10 and 20 for providing predetermined signals, that is, the scan signals and the data signals to the pixels 40 provided in the display panel 30, and a timing controller 50 for controlling the scan/data drivers.

In this regard, the scan driver 10 and the data driver 20 are realized by a plurality of ICs and are mounted on a printed circuit board (PCB) or a flexible printed circuit board (FPCB) so as to be electrically coupled to the printed circuit board on which various elements are mounted. The timing controller 50 is mounted on an additional printed circuit board. A plurality of signal lines for transmitting signals between the scan/data driver and the timing controller are formed between the printed circuit boards.

In addition, recently, as the flat panel display is enlarged, the scan driver 10 is directly mounted in the outline region, that is, the non-display region of the display panel 30 and only the data driver 20 may be mounted on the printed circuit board or the flexible printed circuit board.

The scan/data drivers 10 and 20 and the timing controller 50 are mounted on printed circuit boards, and the printed circuit boards are positioned on the back surface of the display panel 30.

In this regard, the structure including the display panel 30, the scan/data drivers 10 and 20, and the timing controller 50 is referred to as a display module. A frame (not shown) is coupled to the front and back surfaces of the display module so that the assembly of the flat panel display is completed.

The frame is provided to protect the display module from external shock, is positioned on the front and back surfaces of the display panel 30, and includes a front frame in which an image display region is opened, and a back frame positioned on the back surface 32 of the display panel 30. The front frame and the back frame are fastened to each other.

Figure 2:
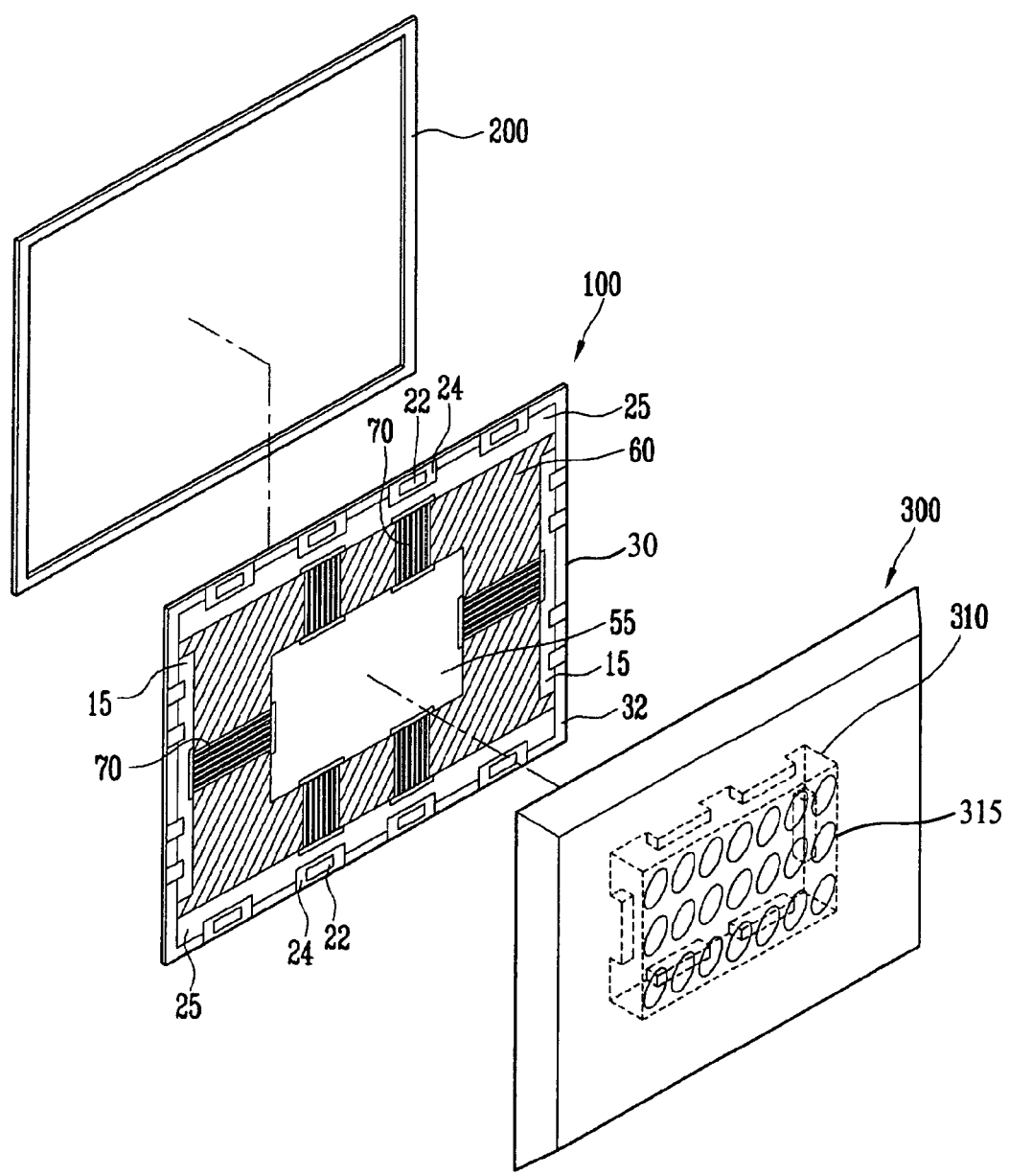
FIG. 2 is an exploded perspective view illustrating the structure of the flat panel display according to an embodiment of the present invention.
Figure 3:
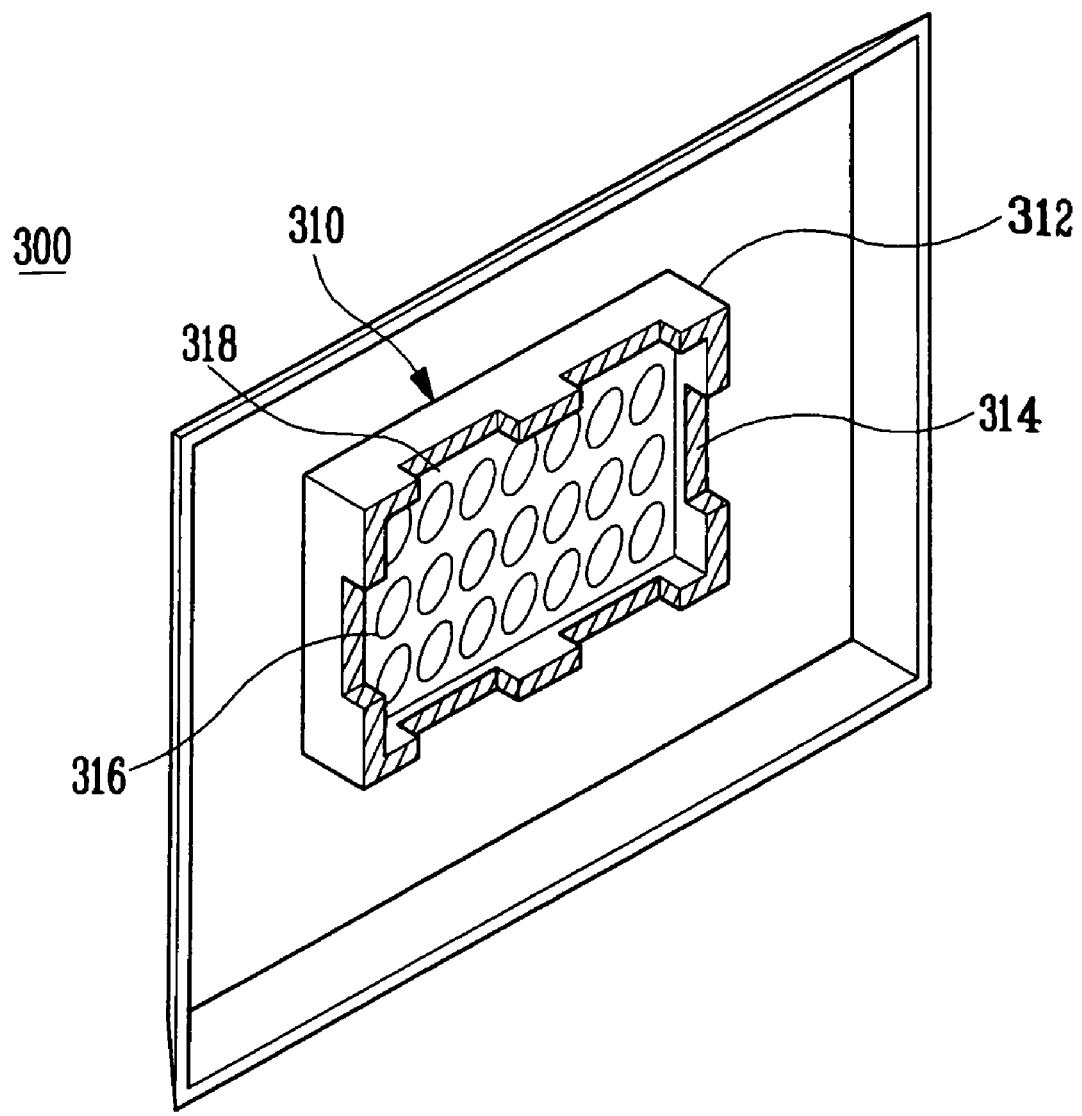
FIG. 3 is a perspective view illustrating the front surface of the back frame of FIG. 2.

FIG. 2 is an exploded perspective view illustrating the structure of the flat panel display according to the embodiment of the present invention. FIG. 3 is a perspective view illustrating the front surface of the back frame of FIG. 2.

Referring to FIG. 2, the flat panel display according to the embodiment of the present invention includes a display module 100, a front frame 200 and a back frame 300, the front frame 200 being coupled to the back frame 300.

The display module 100 includes a display panel 30 for displaying an image, flexible printed circuit boards 24 in which IC type data drivers 22 are mounted on the opposite surface, that is, the back surface 32 of the display panel 30, first printed circuit boards 15 in which an IC type scan driver (not shown) is formed on the front surface of the display panel 30 and which is electrically coupled to the scan driver, second printed circuit boards 25 electrically coupled to the flexible printed circuit boards 24, a third printed circuit board 55 on which the timing controller (not shown) is mounted, and a plurality of signal lines 70 formed between the first/second printed circuit boards 15/25 and the third printed circuit board 55 for transmitting and receiving signals between the scan/data drivers and the timing controller.

In the case of the flat panel display having such a structure, as described above, electromagnetic waves are generated by the printed circuit boards or the various elements mounted on the printed circuit boards, and the signal lines coupled between the printed circuit boards or the various elements of the flat panel display may be damaged by the electromagnetic waves applied from the outside.

The damage caused by electromagnetic waves applied from the outside can be blocked by a metal back frame 300 to some degree. However, the internal electromagnetic interference generated by various electronic elements which constitute the driver and the controller mounted on the printed circuit boards is excited by adjacent electronic elements by the back frame 300. That is, the flat panel display is vulnerable to the internal electromagnetic interference.

In particular, as illustrated in FIG. 2, the timing controller (not shown) mounted on the third printed circuit board 55 positioned in the center of the back surface 32 of the display panel 30 is formed of various electronic elements. The electromagnetic waves generated by the electronic elements mainly cause erroneous operations of the plurality of electronic elements formed on the signal lines 70 and the first and second printed circuit boards 15 and 25, respectively.

In addition, when the printed circuit boards are directly attached on the back surface 32 of the display panel 30, a path which can effectively disperse the heat generated by the display panel 30 and the heat generated by the printed circuit board is not formed so that, when the flat panel display operates for a long time, the flat panel display is vulnerable to heat.

According to the embodiment of the present invention, a conductive heat proof plate 60 is inserted into the back surface 32 of the display panel 30 on which the printed circuit boards 15, 25, and 55 and the signal lines 70 are formed. A shield can 310 covering the timing controller (not shown) is formed in the internal surface region of the back frame 300 corresponding to the third printed circuit board 55 on which the timing controller is mounted. The shield can 310 is electrically coupled to the heat proof plate 60 to reduce the electromagnetic interference noise generated by the timing controller, and to reduce electromagnetic susceptibility (EMS) against the external electromagnetic wave environment. Therefore, the resistance against the electromagnetic waves of the flat panel display is enhanced, that is, the resistance against electromagnetic compatibility (EMC) and the thermal characteristic can be improved.

To be specific, referring to FIGS. 2 and 3, according to the embodiment of the present invention, the heat proof plate 60 made of a material having high conductivity and thermal conductivity is attached to the back surface 32 of the display panel 30.

In this regard, since the heat proof plate 60 has adhesiveness on both surfaces, the heat proof plate 60 is attached to the back surface 32 of the display panel, and the first to third printed circuit boards 15, 25, and 55 are fixed to one surface of the heat proof plate 60 without an additional adhesive tape.

As described above, the heat proof plate 60 is provided between the rear surface 32 of the display panel and the first to third printed circuit boards 15, 25, and 55 so that a path which can effectively disperse the heat generated by the display panel 30 and the heat generated by the printed circuit boards is formed, and a heat proof characteristic is improved.

In addition, the heat proof plate 60 may be formed of a material having a color with high reflectance. Therefore, the reflectance of the light emitted by the display panel 30 is increased to reduce optical loss.

The shield can 310 which covers the timing controller is formed in the internal surface region of the back frame 300 corresponding to the third printed circuit board 55 on which the timing controller is mounted.

The shield can 310 is formed so as to surround the timing controller and to block the timing controller in order to prevent the elements adjacent to the timing controller from erroneously operating due to the electromagnetic interference generated by the timing controller.

Therefore, as illustrated in FIG. 3, the shield can 310 provided in the back frame 300 completely overlaps the area of the third printed circuit board 55 on which the timing controller is mounted. When it is assumed that the third printed circuit board 55 is rectangular, the shield can 310 includes walls 312 corresponding to the circumferential edges of the third printed circuit board 55 so as to block the third printed circuit board 55 from outside influences.

A conductive tape 314 is formed on the back surface of the walls 312 of the shield can, that is, the surface of the walls 312 that contact the heat proof plate 60 to be attached to and electrically coupled to the heat proof plate 60 so that common ground GND is formed.

As described above, the third printed circuit board 55 on which the timing controller is mounted is completely blocked by the walls 312 of the shield can and the top surface of the shield can 310, and the shield can 310 is electrically coupled to the heat proof plate 60 to form common ground. Therefore, the electromagnetic interference emitted from the third printed circuit board 55 on which the timing controller is mounted can be effectively blocked.

In addition, as illustrated in FIG. 3, a plurality of sleet holes 316 are formed in the top surface of the shield can 310.

The sleet holes 316 let the shield can 310 reduce the electromagnetic interference emitted by the third printed circuit board 55 and exhaust the heat generated by the third printed circuit board to the air through corresponding sleet holes 315 (FIG. 2) in back frame 300. Note that sleet holes 315 and 316 may be the same sleet holes when the shield can 310 is integrally formed with the back frame 300.

In this regard, the size and shape of the sleet holes 316 and 315 may vary in accordance with the frequency of the electromagnetic interference generated by the third printed circuit board 55 on which the timing controller is mounted.

As illustrated in FIG. 2 and FIG. 3, since the plurality of signal lines 70 (FIG. 2) for transmitting and receiving signals between the scan/data drivers and the timing controller are formed between the third printed circuit board 55 and the first and second printed circuit boards 15 and 25, a signal line through hole 318 (FIG. 3) through which the signal lines pass through the shield can 310 is formed in a partial region of the shield can 310 for blocking the third printed circuit board 55 (FIG. 2), that is, in a partial region of the walls 312 (FIG. 3) of the shield can 310 corresponding to the part through which the signal lines 70 (FIG. 2) pass.

Figure 4:
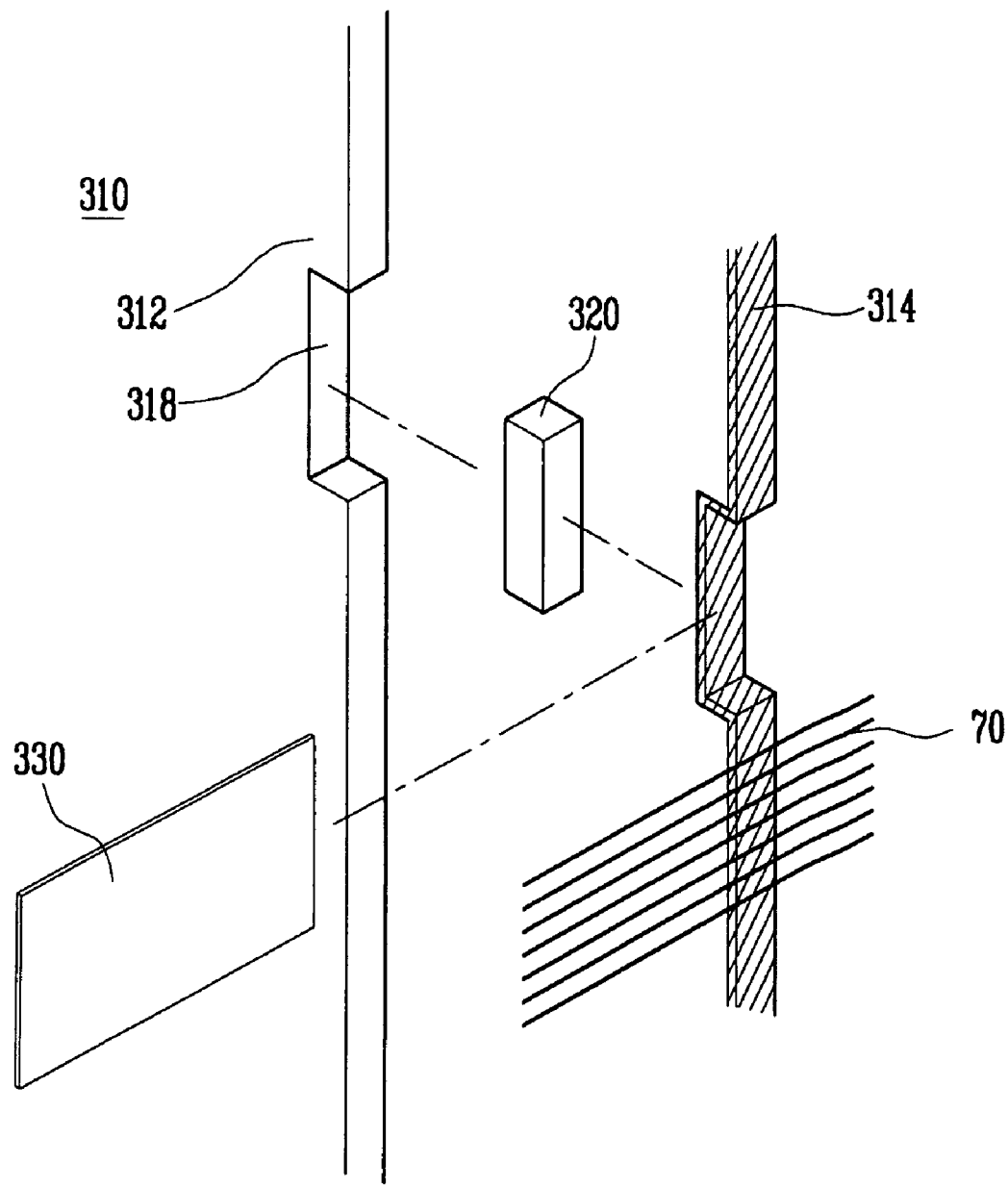
FIG. 4 is an enlarged view illustrating a partial region of the shield can of FIG. 3.

FIG. 4 is an enlarged view of a partial region of the shield can of FIG. 3.

That is, FIG. 4 illustrates the hole through which the signal lines pass, which is formed in a partial region of the walls of the shield can corresponding to the part through which the signal lines pass.

Referring to FIG. 4, the signal line through hole 318 is formed in the partial region of the walls 312 of the shield can 310 in order to remove interference of the signal lines 70 coupled from the third printed circuit board 55 (FIG. 2) on which the timing controller is mounted to the first and second printed circuit boards 15 and 25.

In this case, in order to prevent the electromagnetic interference emitted from the third printed circuit board 55 from leaking through the signal line through hole 318 (FIG. 4), a cushion tape 320 made of an elastic material is attached on the top surface of the signal line through hole 318, and the conductive tape 314 formed on the bottom surface of the walls of the shield can 310 is attached on the bottom surface of the cushion tape 320.

That is, the signal lines 70 positioned in the signal line through hole 318 are prevented from being pressed by the cushion tape 320, spaces between the shield can 310 and the signal lines 70 are closed by the conductive tape 314, and the shield can 310 is electrically coupled to the heat proof plate 60 to form a closed structure. Therefore, the electromagnetic interference block effect can be improved by the shield can 310.

In addition, as illustrated in FIG. 4, a conductive shield tape 330 having an area that overlaps the signal lines is further formed on the top surface of the signal lines 70, that is, between the conductive tape 314 and the signal lines 70, so that the electromagnetic interference emitted from the signal lines 70 as well as the electromagnetic interference emitted from the third printed circuit board 55 can be effectively blocked.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flat panel display, comprising:
a display module including a display panel displaying an image on a front surface, first and second printed circuit boards attached on a back surface of the display panel and electrically coupled to a scan driver and a data driver, a third printed circuit board on which a timing controller is mounted, a plurality of signal lines coupled between the printed circuit boards to transmit and receive signals between the printed circuit boards, and a heat proof plate inserted between the back surface of the display panel and the first, second and third printed circuit boards;
a front frame coupled to a back frame to enclose the display module; and
the back frame including a shield can formed in an internal surface region of the back frame, the shield can covering the third printed circuit board on which the timing controller is mounted, when the back frame is coupled to the front frame, the third printed circuit board being uncovered when the back frame is not coupled to the front frame.

2. The flat panel display as set forth in claim 1, wherein the shield can completely overlaps an area of the third printed circuit board on which the timing controller is mounted, and comprises walls corresponding to circumferential edges of the third printed circuit board.

3. The flat panel display as set forth in claim 2, further comprising a conductive tape formed on a bottom surface of the shield can walls which contact the heat proof plate to electrically couple the heat proof plate to the shield can.

4. The flat panel display as set forth in claim 1, further comprising a plurality of sleet holes formed on a top surface of the shield can for externally exhausting heat generated by the third printed circuit board.

5. The flat panel display as set forth in claim 3, further comprising signal line through holes are formed in a partial region of the walls of the shield can so that the signal lines coupled from the third printed circuit board to the first and second printed circuit boards pass through the walls.

6. The flat panel display as set forth in claim 5, further comprising an elastic cushion tape attached, respectively, between a bottom surface of each signal line through hole and a top surface of the conductive tape.

7. The flat panel display as set forth in claim 6, further comprising a conductive shield tape disposed between the conductive tape and the signal lines, the conductive shield tape having an area which overlaps the signal lines.

8. The flat panel display as set forth in claim 1, wherein the scan driver and the data driver are formed of a plurality of integrated circuits.

9. The flat panel display as set forth in claim 8, wherein the plurality of integrated circuits that constitute the data driver are mounted on flexible printed circuit boards, and wherein the flexible printed circuit boards are coupled to the second printed circuit board.

10. The flat panel display as set forth in claim 1, wherein the heat proof plate is made of a material having high electrical conductivity and thermal conductivity.

11. The flat panel display as set forth in claim 1, wherein the heat proof plate is made of a material having a color having high reflectance.

12. A flat panel display comprising:
a display panel disposed between a front frame and a back frame;
a heat proof plate mounted to a rear surface of the display panel; and
the back frame including a shield can formed in an internal surface region of the back frame, the shield can covering a printed circuit board on which a timing controller is mounted to the heat proof plate, when the back frame is mounted with the front frame, the printed circuit board being uncovered by the shield can when the back frame is not mounted to the front frame.

13. The flat panel display as set forth in claim 12, said shield can comprising a plurality of sleet holes formed on a top surface of the shield can for exhausting heat generated by the printed circuit board to ambient air.

14. The flat panel display as set forth in claim 13, said shield can further comprising sleet can walls corresponding to circumferential edges of the printed circuit board, said sleet can walls comprising signal line through holes.

15. The flat panel display as set forth in claim 14, further comprising a conductive tape formed on a bottom surface of the shield can walls to electrically couple the shield can to the heat proof plate.

16. The flat panel display as set forth in claim 15, further comprising an elastic cushion tape attached, respectively, between a bottom surface of each signal line through hole and a top surface of the conductive tape.

17. The flat panel display as set forth in claim 13, the shield can and the back frame comprising a shared plurality of sleet holes formed through a top surface of the shield can and a back surface of the back frame, the sleet holes exhausting heat generated by the printed circuit board to ambient air.

18. A flat panel display having a display panel disposed between a front frame and a back frame and a a heat proof plate mounted to a rear surface of the display panel, the flat panel display comprising:
a printed circuit board on which a timing controller is mounted to the heat proof plate; and
a shield can attached to an internal surface region of the back frame, the shield can covering the printed circuit board and timing controller, the shield can comprising a first plurality of sleet holes formed on a top surface of the shield can for exhausting heat generated by the printed circuit board; and
a second plurality of sleet holes formed in the back cover, the first plurality of sleet holes corresponding to and aligned with the second plurality of sleet holes.

* * * * *